United States Patent [19]

DeVries

[11] Patent Number: 4,460,995

[45] Date of Patent: Jul. 17, 1984

[54] NARROW FOCUS COMPENSATING TRANSDUCER FOR SURFACE ACOUSTIC WAVE FILTER

[75] Inventor: Adrian J. DeVries, Mount Prospect, Ill.

[73] Assignee: Zenith Radio Corporation, Glenview, Ill.

[21] Appl. No.: 370,313

[22] Filed: Apr. 21, 1982

[51] Int. Cl.³ .............................................. H03H 9/64
[52] U.S. Cl. .............................. 310/313 R; 333/194; 333/195; 333/196
[58] Field of Search ............................... 333/150–155, 333/193–196; 310/313 R, 313 A, 313 B, 313 C, 313 D

[56] References Cited

U.S. PATENT DOCUMENTS 4,344,051 8/1982 Coussot .............................. 333/194

Primary Examiner—Marvin L. Nussbaum

[57] ABSTRACT

A compensation scheme is disclosed which avoids the requirement of high alignment accuracy, and thus reduces the production cost of a surface acoustic wave filter, by employing a compensating transducer system which is arranged with its fingers parallel to those of the receiving transducer. The requirement of receiver sensitivity at the trap frequencies is nevertheless achieved by using a very narrow compensating beam width. The narrowness of the compensating beam also allows it to pass directly through a multi-strip coupler. The degree of compensation achieved is controlled by aiming the compensating beam at a small region of the apodized receiving transducer located at the extremity of the major lobe; by restricting the aperture of the compensating transducer system; and by trimming the printed circuit capacitor which couples the compensating transducer system to the electrical input signal. The degree of compensation achieved is made to differ at the upper and lower trap frequencies by using a compound compensating transducer system employing two individual transducers spaced apart the proper distance to be more or less in phase opposition to each other at one of the trap frequencies. The individual transducers nevertheless remain largely in phase with each other at the other trap frequency, so as to aid each other in producing the compensation effect.

24 Claims, 1 Drawing Figure

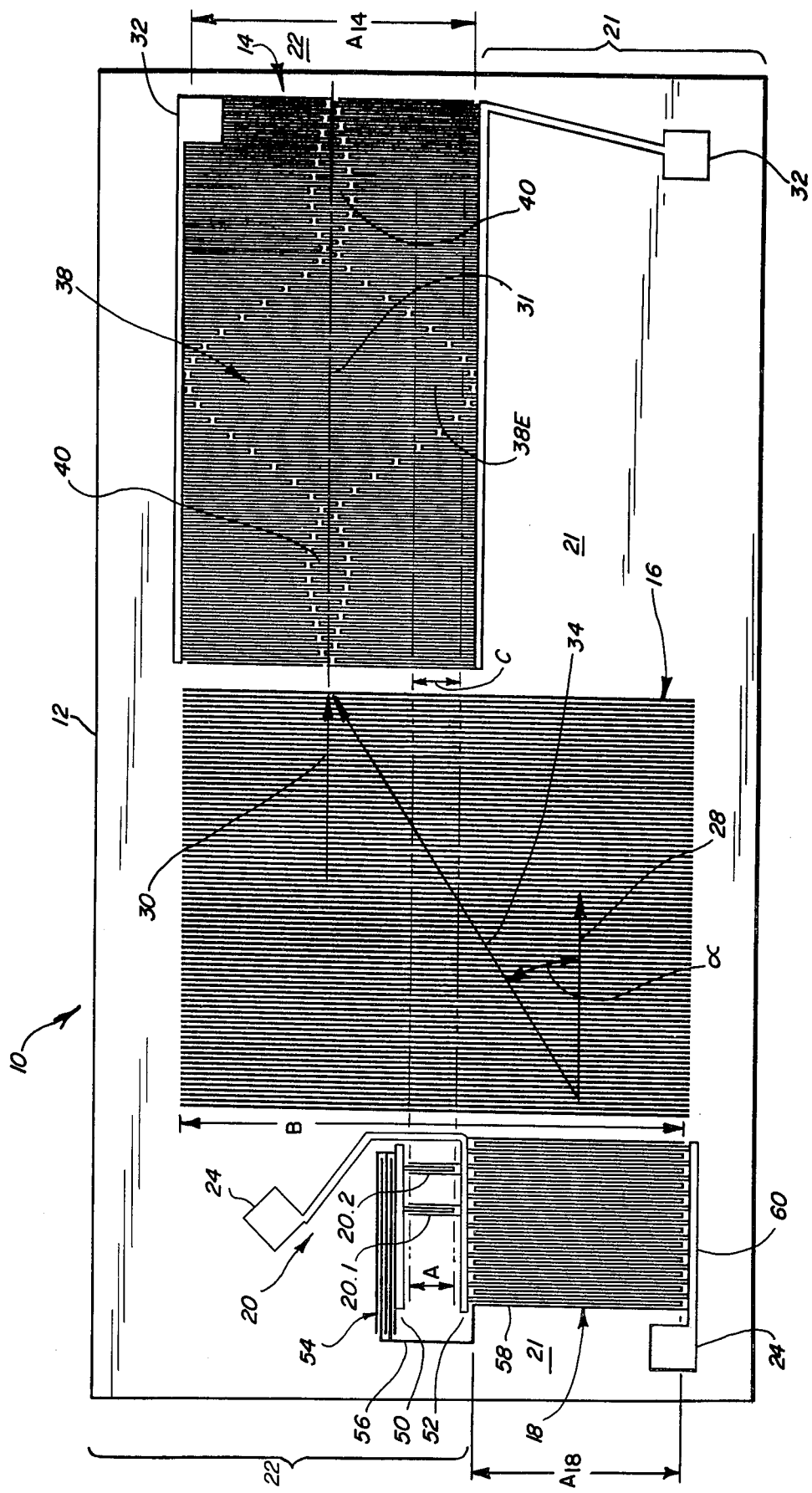

NARROW FOCUS COMPENSATING TRANSDUCER FOR SURFACE ACOUSTIC WAVE FILTER

This invention relates generally to surface acoustic wave devices, and particularly to a surface acoustic wave filter which provides for compensation at one or more trap frequencies.

BACKGROUND

Filters employing surface acoustic wave interdigital transducers are widely used in communications receivers, such as home television sets. The intermediate frequency sections of such TV sets often employ filters of this type which are designed to have a pass-band from 39.75 to 47.25 MHz. It is desired that such filters have deep, wide traps (response nulls) at the upper and lower cut-off frequencies of the pass-band, so that the filter will reject spurious signals (interference) which is often present at those frequencies.

Usually an attempt is made to achieve this type of frequency characteristic by using a finger-length-weighted (apodized) design for one or more of the interdigital transducers. Such finger-length-weighting tailors the frequency response of the transducer(s) to suit the desired filter characteristics. Theoretically, it accomplishes this by causing the transducer(s) to transmit or receive essentially zero acoustic energy at the trap frequencies.

In actual practice, however, zero response is not achieved. Apodization only controls the response of a transducer with respect to acoustic energy which is propagated along an axial direction, i.e. a direction perpendicular to the fingers of the transducer. That unfortunately is not the only direction of propagation which is encountered. The sending transducer propagates a minor but significant fraction of its acoustic energy in off-axis directions by a process of diffraction. This off-axis signal is then sensed by the receiving transducer, which has a substantially different frequency response thereto than it has with respect to axially propagated signals. In particular, there is a substantial undesired response to off-axis signals at the trap frequencies. The result is typically a spurious (i.e. diffraction-related) response which, at the upper trap frequency, may be as large as −40 dB.

Since this undesired response is due primarily to energy arriving along an off-axis path, it is quite difficult to calculate its magnitude theoretically. Consequently no straight-forward design changes are apparent which could tailor the frequency response to off-axis signals. Instead, the design approach which has typically been taken is provide the filter with one more additional transducers which perform a compensating function; i.e. they provide a signal of opposite phase and equal magnitude to counteract the undesired response at one of the trap frequencies.

But there is an inherent difficulty with most of the compensation schemes which are known to the prior art. Since an apodized receiving transducer is designed to have a zero response to axials signals at a trap frequency, it is difficult for such a transducer to develop any response to a compensating signal at such frequencies if it arrives along an axial path.

One suggestion for circumventing this dilemma is to slant the fingers of the compensating transducer so that the compensating signal is also transmitted at an off-axis angle, and therefore will produce as great a transducer response as the diffraction signal does. This works well as long as the apodized transducer is very accurately aligned with the crystalline axes of the filter substrate. But such an arrangement is quite sensitive to misalignment, and therefore the degree of alignment accuracy required to make it function satisfactorily adds significantly to the cost of the filter. Since such filters are primarily intended for use in a cost-competitive product such as home TV sets, this is an important consideration.

This invention, however, recognizes another way of avoiding the unresponsiveness of the receiving transducer at trap frequencies, and thereby permitting effective compensation of the spurious response. An apodized receiving transducer is designed to have a null response to trap frequency signals only if those signals are of uniform amplitude across the aperture of the transducer (i.e. across its interdigitated finger length). If an acoustic signal impinging upon an apodized receiving transducer lacks such uniformity, then the signal will induce a significant output in the transducer even if it is at one of the trap frequencies at which the transducer would otherwise not develop any response.

Accordingly the invention contemplates a filter which illuminates the receiving transducer with a trap frequency compensating signal in the form of a beam of acoustic energy which is substantially narrower than the aperture of the receiving transducer.

Preferably the narrow beam is aimed at an off-axis portion of the active transducing area of an apodized receiving transducer, such as one extremity of the major lobe of the active area, so as to control the amplitude of the response. Such a restricted area of the apodized receiving transducer has a much broader frequency response than the entire (i.e. full aperture) transducer does. As a result, there is a significant response at the trap frequency, but without the alignment problems which attend the slanted finger design.

Various different geometries may be utilized for full-aperture coupling of the primary acoustic signal to the receiving transducer while restricting the compensating acoustic signal to partial-aperture coupling. A preferred approach, which has the advantage of suppressing bulk mode response, employs a multi-strip coupler. Such a coupler is effective for full-aperture coupling of sending and receiving transducers which are located on different substrate track areas, but it is essentially transparent to a narrow beam compensating signal. This permits the compensating signal to be direct-coupled.

The electrical input to the filter is preferably coupled to the compensating transducer by a trimmable printed circuit capacitor, so as to permit easy adjustment of the magnitude of the compensating signal.

The two trap frequencies can be compensated to different degrees, by using a pair of compensating transducers which are phased so as to at least partially cancel each other at one of the trap frequencies but reinforce each other at the other trap frequency.

These and other features, objects and advantages of the invention will now be described in detail in connection with a particular embodiment. The invention is illustrated by this embodiment, but is not limited thereto. The detailed description is intended to be read in conjunction with the following drawing:

BRIEF DESCRIPTION OF THE DRAWING

The drawing is a top plan view of a surface acoustic wave filter, and shows the pattern in which thin metal film elements are deposited over the surface of a crystal substrate.

DETAILED DESCRIPTION OF THE PREFERRED EMBODIMENT

The drawing illustrates a surface acoustic wave filter 10 in accordance with this invention. The filter includes a substrate 12 formed of a piezo-electric material, for example monocrystalline lithium niobate ($LiNbO_3$). Over the upper surface of this substrate thin metal films are deposited in a selective pattern defining various electro-acoustic surface wave transducers. These include an apodized (finger-length-weighted) receiving interdigital transducer 14, a multi-strip coupler 16, and a plurality of sending interdigital transducers. Among the latter transducers are a primary signal sending transducer 18 and a compensating signal sending transducer system 20.

In conventional fashion, the receiving transducer 14 and sending transducer 18 are located on different track areas 21 and 22 respectively on the upper surface of the substrate 12, so that they are not coupled by bulk mode reflections. The multi-strip coupler 16 is then necessary to transfer acoustic signals laterally between the tracks 21 and 22.

The electrical input signal which drives the filter (e.g. the signal input to the I.F. section of a TV receiver) is connected to the sending transducer 18 by means of a pair of input terminal pads 24, causing that transducer to propagate a corresponding surface acoustic signal along track 21. That signal, represented by an arrow 28 which coincides with the axis of transducer 18, travels along track 21 in the direction of the multi-strip coupler 16. The coupler transfers the signal laterally to track 22, after which it travels along track 22 until it reaches transducer 14. The latter path is indicated by an arrow 30 which coincides with the axis 31 of the latter transducer.

In response to the arriving acoustic signal, the receiving transducer develops an electrical output which is taken off at a pair of output terminal pads 32. This electrical output is filtered according to the frequency response characteristics of the transducer system 18-14. In an I.F. filter for a home TV receiver the frequency response characteristic will normally be a pass-band extending from a lower cut-off of about 39.75 MHz to an upper cut-off of about 47.25 MHz, with deep traps or nulls in the response curve at both of these cut-off frequencies.

But this theoretical frequency response applies only to the signal which travels along the tracks 21 and 22 in directions 28 and 30 parallel to the axes of the transducers 18 and 14. In addition to the signal travelling along path 28 and 30, there is a diffraction signal which is emitted by the sending transducer 18. Part of that diffraction signal (represented by arrow 34) travels at an angle alpha to the axes of the transducers, and passes diagonally across the coupler 16 directly to the receiving transducer 14. This is troublesome because the response of that transducer to the off-axis signal 34 is different from the theoretical response calculated for axial signals. Instead of zero response at the trap frequencies there is a significant spurious response, particularly at the upper trap (47.25 MHz). Thus, compensation is necessary.

Compensation is usually achieved by using an out-of-phase acoustic signal at the trap frequency. But if the compensating signal is beamed along an axial path (parallel to axis 31), and is coupled to the full aperture (maximum interdigitated finger length) $A_{14}$ of the apodized receiving transducer 14, then the frequency response of that transducer will make it insensitive to the compensating signal simply because it is not designed to respond to trap frequencies under full-aperture coupling conditions.

If the compensating transducer has fingers which are oriented at angle alpha, however, then the compensating signal will impinge upon the receiving transducer 14 at a like angle. The transducer will then respond to the compensating signal to the same extent as it does to the spurious (diffraction) signal, thus making compensation possible. But very accurate transducer alignment is required for this scheme to work, and that increases the cost of the filter 10.

In accordance with this invention, the compensating acoustic signal is propagated in a direction parallel to the axial path 30, but is confined to a narrow beam-width C considerably smaller than the receiving transducer aperture $A_{14}$. The frequency response of the receiving transducer 14 to such a narrow beam is much broader than it is to a full-aperture signal, and therefore a significant compensating output is developed at the trap frequencies.

The compensating signal is directed at a particular portion of the receiving transducer 14 which is chosen so that only a limited number of the interdigitated fingers thereof feel the acoustic energy of the beam traversing path C. The apodization envelope of transducer 14 divides the active (interdigitated) area of the transducer into a major lobe 38 in the central region of the transducer and pair of minor lobes 40 flanking the major lobe at opposite ends of the transducer. The compensating beam path C is laterally offset from the longitudinal axis 31 of transducer 14 by a sufficient distance that it intersects only a portion of the active area of the transducer. In the example shown, the intersected portion is relatively remote from the transducer axle 31, and lies entirely outside the minor lobes 40; i.e. the intersected portion is an extremity 38E of the major lobe 38.

Since the extremity 38E is considerably narrower (in the axial direction) than the remainder of the major lobe 38, the beam path C intersects only a fraction of the number of interdigitated transducer finger pairs which are included in the entire major lobe 38. Consequently the compensating beam interacts only with a number of interdigitated finger pairs which is much smaller than the total number of interdigitated finger pairs in the whole transducer 14. (The rest of the transducer 14 acts as a capacitive load in parallel with the interacting finger pairs). The fact that only a small fraction of the total number of finger pairs interacts with the compensating beam advantageously affects both the frequency response and the amplitude of the response of the receiving transducer 14 to the compensating beam.

A fair estimate of the frequency response of this portion 38E of the receiving transducer 14 is that it has a pass-band from about 35 to about 52 MHz, which is broad enough to permit a significant response at the trap frequencies of 39.75 and 47.25 MHz.

The fact that the compensating beam path C intersects a smaller number of interdigitated finger pairs than the primary signal beam sent by transducer 18 also serves to keep the amplitude of the compensation response smaller than the amplitude of the pass-band (primary signal) response. This is important because the spurious response to be compensated is significantly (about 40 dB) smaller than the pass-band response.

The source of the compensating beam is the compensating transducer system 20. The latter comprises one or more interdigital transducer, each of which has a relatively narrow aperture $A_{20}$ equal to the desired compensating beam width C. The compensating transducer system is electrically coupled, by means of bus bars 50 and 52, to the same I.F. input signal as the sending transducer 18. The bus bar 52 is connected directly to one of the input terminal pads 24, and is common to both the sending transducer 18 and the compensating transducer system 20. The other bus bar 50 is coupled by means of a printed circuit capacitor 54, a printed circuit lead 56, a finger 58 of sending transducer 18, and another bus bar 60 to the other input terminal pad 24.

The fingers of the compensating transducer system 20 are substantially parallel to those of the receiving transducer 14. Consequently the compensating signal is propagated along a path which is parallel to the axis 31 of transducer 14, and its effect upon the receiving transducer is therefore predictable and can be calculated in advance. Yet despite this axial propagation direction, the narrow breadth C of the compensating beam compared to the size of aperture $A_{14}$ causes the compensating beam to produce a greater than null response in the receiving transducer at trap frequencies.

The axial propagation direction of the compensating beam also causes the filter 10 to be much less sensitive to the accuracy of alignment of the compensating transducer system 20 upon the substrate 12. If the surface acoustic velocity on a substrate of Y-cut $LiNbO_3$ is plotted as a function of the angle between the direction of acoustic propagation and the Z axis of the crystal, it is found that at an angle of 0 degrees the first derivative is zero because the curve passes through a relative maximum exactly at that point. Therefore if all the transducers in the filter 10 are aligned with their fingers substantially perpendicular to the Z axis of the substrate 12, the acoustic propagation direction for all signals (except the diffracted one) will be 0 degrees, and consequently minor amounts of misalignment, such as might occur in production, will not seriously affect the acoustic velocity.

In contrast, when the compensating transducer is is at an angle to the other transducers, then not all the transducers can propagate in the preferred direction of 0 degrees; and those which propagate at some angle slightly above or below 0 degrees must operate in a region of the graph where the first derivative has some significant value above or below zero. Under those circumstances the acoustic velocity varies substantially as a function of relatively small amounts of misalignment. Then when such misalignment occurs in production, the resulting variations from the theoretical value of the acoustic velocity will not permit the filter to perform up to its design specifications. This problem is avoided by using the axial propagation technique of this invention.

The narrow breadth C of the compensating beam compared to the coupler breadth B causes it to pass directly through the coupler 16 without undergoing any significant attenuation, because such multi-strip devices are substantially transparent to acoustic wavefronts that are substantially narrower than half the coupler breadth B. As a result, the compensating transducer system 20 can be positioned on the same acoustic track 22 as the receiving transducer 14, so that the compensating transducer system is in alignment with the receiving transducer (i.e. their respective apertures $A_{20}$ and $A_{14}$ at least partially overlapping) for direct acoustic coupling thereto.

This is advantageous because it means that the aperture of the sending transducer 18 does not have to be made smaller in order for the sending transducer to share its acoustic track 21 with the compensating transducer system 20. A smaller sending transducer aperture would mean a smaller acoustic signal. The compensating beam has a small enough amplitude so that bulk mode echos are not a serious problem, even though the compensating transducer system 20 is located on the same track as the receiving transducer 14.

For compensation of the upper trap frequency of 47.25 MHz, the compensating transducer system 20 is spaced from the receiving transducer 14 just the right distance so that the 47.25 MHz component of the compensating signal arrives at the receiving transducer substantially 180 degrees out of phase with the 47.25 MHz component of the diffraction signal 34 propagated by the sending transducer 18. The amplitude of the compensating signal at the upper trap frequency should also be substantially equal to that of the diffraction signal at that frequency, so that the two cancel each other out.

Since the signal to be compensated is relatively small compared to the desired signal (about $-40$ dB), the amplitude of the compensating signal must be kept correspondingly small. This is accomplished in several ways. The narrow aperture $A_{20}$ of the compensating transducer system tends to reduce the amplitude of the compensating signal. In addition, the fact that the compensating beam is laterally displaced from the axis 31 of the receiving transducer, and therefore intersects the active area of thereof only at the extremity 38E of the major lobe 38, also helps to reduce the compensating signal amplitude. Finally, the amplitude of the compensating signal depends upon the capacity of the printed circuit capacitor 54 which couples the compensating transducer system 20 to the electrical input signal reaching the terminal pads 24; and that capacity can be trimmed by altering the size of the printed circuit electrodes forming the capacitor.

In most cases the degreee of compensation required at the lower trap frequency of 39.75 MHz is much less than at the upper trap frequency. Consequently, when the amplitude of the compensating signal at the upper trap frequency is equal to that of the diffraction signal at that frequency, the amplitude of the compensating signal at the lower trap frequency may be too great. In order to deal with this problem, the compensating transducer system comprises two individual compensating transducers 20.1 and 20.2, which are spaced apart along the direction of propagation of the compensating beam by a distance such that they largely cancel each other out at the lower trap frequency of 39.75 MHz. If total cancellation is desired, the appropriate spacing is $(N+\frac{1}{2})$ times the acoustic wavelength at the lower trap frequency, where N is an integer.

The question which then arises, however, is whether the appropriate phase compensation relation at the upper trap frequency can be maintained between the receiving transducer 14 and *both* of the individual compensating transducers 20.1 and 20.2, when a phase cancelation relation is introduced at the lower trap frequency *between* the individual compensating transducers. If the parameter N mentioned in the preceding paragraph is chosen to be 2, then the respective contributions of the individual compensating transducers 20.1 and 20.2 are nearly in phase at the upper trap frequency of 47.25 MHz, and therefore at that frequency the two individual compensating transducers will simultaneously be in compensating phase relationship to receiving transducer 14. Thus the contribution of both of the individual compensating transducers will be effective in compensating for the diffraction signal at the upper trap frequency, even though at the same time they largely oppose each other at the lower trap frequency.

In a more sophisticated embodiment of the invention, the compensating effect of the transducer system 20 can be made even more frequency-selective by apodizing (finger-length-weighting) the compensating transducer or transducers so that greater compensation effect is achieved at the upper trap frequency than at the lower.

It will now be appreciated that the compensation scheme of this invention avoids the requirement of high alignment accuracy, and thus reduces the production costs of a surface acoustic wave filter, by employing a compensating transducer system which is arranged with its fingers parallel to those of the receiving transducer. The requirement of receiver sensitivity at the trap frequencies is nevertheless achieved by using a very narrow compensating beam width. The narrowness of the compensating beam also allows it to pass directly through a multi-strip coupler. The degree of compensation achieved is controlled by aiming the compensating beam at a small region of the apodized receiving transducer located at the extremity of the major lobe; by restricting the aperture of the compensating transducer system; and by trimming the printed circuit capacitor which couples the compensating transducer system to the electrical input signal. The degree of compensation achieved can be made to differ at the upper and lower trap frequencies by using a compound compensating transducer system employing two individual transducers spaced apart the proper distance to be more or less in phase opposition to each other at one of the trap frequencies. The individual transducers nevertheless remain largely in phase with each other at the other trap frequency, so as to aid each other in producing the compensation effect.

The foregoing detailed description specifies an embodiment which is presently preferred, and which serves to illustrate this invention. But other embodiments may be imagined now or in the future which may incorporate one or more aspects of the invention. Therefore the scope of protection accorded to this invention should not be limited to the particulars of this description, but instead should be determined by the following claims. These claims, moreover, should be interpreted consistently with the general principles and novel teachings expressed herein.

The invention claimed is:

1. A surface acoustic wave filter comprising:
    transducer means for receiving an electrical input signal and sending a surface acoustic wave signal;
    apodized transducer means acoustically coupled to said sending transducer means for receiving said surface acoustic wave signal and producing an electrical output signal, said apodized receiving transducer having a selected surface acoustic wave aperture;
    and compensating transducer means for receiving said electrical input signal and sending a diffraction-compensating surface acoustic wave signal, said compensating transducer means being acoustically coupled to send said compensating signal to said apodized receiving transducer means and having an aperture substantially smaller than said selected aperture thereof.

2. A surface acoustic wave filter comprising:
    transducer means for receiving an electrical input signal and sending a surface acoustic wave signal;
    transducer means acoustically coupled to said sending transducer means for receiving said surface acoustic wave signal and producing an electrical output signal, said receiving transducer having a selected surface acoustic wave aperture;
    compensating transducer means for receiving said electrical input signal and sending a diffraction-compensating surface acoustic wave signal, said compensating transducer means being acoustically coupled to send said compensating signal to said receiving transducer means and having an aperture substantially smaller than said selected aperture thereof;
    said surface acoustic wave filter defining a pass band bonded by upper and lower trap frequencies, and said receiving transducer means being designed to have a relatively low response to acoustic signals of at least one of said trap frequencies when signals of said one trap frequency have a wavefront breadth not substantially smaller than said selected aperture.

3. A surface acoustic wave filter comprising:
    transducer means for receiving an electrical input signal and sending a surface acoustic wave signal;
    transducer means acoustically coupled to said sending transducer means for receiving said surface acoustic wave signal and producing an electrical output signal, said receiving transducer having a selected surface acoustic wave aperture;
    and compensating transducer means for receiving said electrical input signal and sending a diffraction-compensating surface acoustic wave signal, said compensating transducer means being acoustically coupled to send said compensating signal to said receiving transducer means and having an aperture substantially smaller than said selected aperture thereof;
    said surface acoustic wave filter defining a pass band bounded by upper and lower trap frequencies, and said receiving transducer means being designed to have a relatively low response to acoustic signals of at least one of said trap frequencies when signals of said one trap frequency have a wavefront breadth substantially less than said selected aperture;
    said compensating transducer means being arranged relative to said sending and receiving transducer means so that acoustic signals of said one trap frequency sent by said compensating transducer means and acoustic signals of said one trap frequency sent by said sending transducer means arrive at said receiving transducer means substantially in phase opposition to each other.

4. A surface acoustic wave filter as in claim 3 wherein said compensating and receiving transducer means are both of the interdigital type and are oriented with their respective fingers substantially parallel to each other.

5. A surface acoustic wave filter as in claim 4 wherein said compensating transducer means is positioned so that its aperture at least partially overlaps that of said receiving transducer means.

6. A surface acoustic wave filter as in claim 5 wherein the aperture of said compensating transducer means is entirely included within the aperture of said receiving transducer means.

7. A surface acoustic wave filter as in claim 5 wherein said receiving transducer means is finger-length-weighted, and said compensating and receiving transducer means are substantially noncoaxial.

8. A surface acoustic wave filter as in claim 7 wherein said finger-length-weighted receiving transducer means has an active area envelope with a major lobe, and the axis of said compensating transducer means intersects a portion of said major lobe at a location which is remote from the axis of said receiving transducer means.

9. A surface acoustic wave filter comprising:
sending transducer means for sending a surface acoustic wave signal, including means for receiving an electrical input signal;
receiving transducer means acoustically coupled to said sending transducer means for receiving said surface acoustic wave signal, said receiving transducer having a selected aperture;
and compensating transducer means acoustically coupled to said receiving transducer means, said compensating transducer means including means for electrically coupling to said input signal, and having an aperture substantially smaller than said selected aperture;
said receiving transducer means being designed to have a relatively low response to acoustic signals of first and second trap frequencies when said trap frequency signals have a wavefront breadth at least equal to said selected aperture;
said compensating transducer means being arranged relative to said sending and receiving transducer means so that acoustic signals of said first trap frequency sent by said compensating transducer means and acoustic signals of said first trap frequency sent by said sending transducer means arrive at said receiving transducer means substantially in phase opposition to each other;
and said compensating transducer means comprising at least two individual transducers arranged to transmit respective individual surface acoustic signals to said receiving transducer means;
said individual transducers being arranged so that said individual signals arrive at said receiving transducer means substantially in phase opposition to each other at said second trap frequency.

10. A surface acoustic wave filter as in claim 9 wherein said individual transducers are arranged so that said individual surface acoustic signals are transmitted to said receiving transducer means over a common path.

11. A surface acoustic wave filter as in claim 10 wherein said individual transducers are spaced apart a distance substantially equal to $(N+\frac{1}{2})$ times the wavelength of said individual signals at said second trap frequency, where N is an integer.

12. A surface acoustic wave filter as in claim 11 wherein $N=2$.

13. A surface acoustic wave filter comprising:
sending transducer means for sending a surface acoustic wave signal, including means for receiving an electrical input signal;
receiving transducer means acoustically coupled to said sending transducer means for receiving said surface acoustic wave signal, said receiving transducer having a selected aperture;
compensating transducer means acoustically coupled to said receiving transducer means, said compensating transducer means including means for electrically coupling to said input signal, and having an aperture substantially smaller than said selected aperture;
and trimmable printed circuit capacitor means coupling said compensating transducer means to said sending transducer means.

14. A surface acoustic wave filter comprising:
a piezoelectric substrate;
sending transducer means on said substrate for sending a surface acoustic wave signal, including means for receiving an electrical input signal;
receiving transducer means on said substrate acoustically coupled to said sending transducer means for receiving said surface acoustic wave signal, said receiving transducer having a selected aperture;
and compensating transducer means on said substrate acoustically coupled to said receiving transducer means, said compensating transducer means including means for electrically coupling to said input signal, and having an aperture substantially smaller than said selected aperture;
the apertures of said sending and receiving transducer means being positioned upon said substrate so that their respective apertures are not overlapping;
and means on said substrate acoustically coupling said sending and receiving transducer means.

15. A surface acoustic wave transducer as in claim 14 wherein:
said coupling means is a multi-strip device;
said compensating and receiving transducer means are positioned on opposite sides of said multi-strip device, with their apertures in at least partially overlapping relationship;
and the aperture of said compensating transducer means is substantially smaller than the breadth of said multi-strip device whereby said device is substantially transparent to acoustic signals emanating from said compensating transducer means.

16. A surface acoustic wave filter comprising:
finger-length-weighted interdigital apodized transducer means having an axis, an aperture, and an active area envelope with a major lobe;
and second transducer means for directing a surface acoustic beam which is narrower than said aperture along a path which intersects a portion of said major lobe at a location which is remote from said axis.

17. A surface acoustic wave filter as in claim 16 wherein said directing means comprises second interdigital transducer means having an aperture substantially smaller than that of said finger-length-weighted transducer means.

18. A surface acoustic wave filter as in claim 17 wherein the fingers of each of said interdigital transducer means are substantially parallel to those of the other.

19. A surface acoustic wave device comprising:

receiving apodized transducer means having a selected aperture;

other transducer means for sending first and second acoustic signals; and means for acoustically coupling said signals to said receiving transducer means, integrating the acoustic effect of said first signal upon said receiving transducer means over said selected aperture, and confining said second signal to less than the entirety of said selected aperture.

20. A surface acoustic wave device comprising:

receiving transducer means having a selected aperture;

transducer means for sending first and second acoustic signals;

and means for acoustically coupling said signals to said receiving transducer means, integrating the acoustic effect of said first signal upon said receiving transducer means over said selected aperture, and confining said second signal to less than the entirety of said selected aperture;

said device being so arranged that said first and second signals arrive at said receiving transducer means substantially out of phase with each other at a selected compensation frequency.

21. A surface acoustic wave device as in claim 19 wherein said coupling and integrating means comprises multi-strip coupler means.

22. A surface acoustic wave device as in claim 21 wherein said confining means comprises transducer means having an aperture substantially narrower than said selected aperture and substantially narrower than the breadth of said multi-strip coupler means.

23. A surface acoustic wave device as in claim 22 wherein said narrow-aperture transducer means comprises a pair of transducers arranged to transmit respective acoustic signals which arrive at said receiving transducer means substantially out of phase with each other at a selected compensation frequency.

24. In a surface acoustic wave device of the type having receiving transducer means, sending transducer means acoustically coupled to said receiving transducer means, and compensating transducer means acoustically coupled to said receiving transducer means and phased oppositely to said sending transducer means at a first interference frequency; the improvement wherein:

said compensating transducer means comprises a pair of individual transducer means phased oppositely to each other at a second interference frequency.

* * * * *